US012622242B2

(12) United States Patent
Cen et al.

(10) Patent No.: US 12,622,242 B2
(45) Date of Patent: May 5, 2026

(54) SELECTIVE SELF-ASSEMBLED MONOLAYER (SAM) REMOVAL

(71) Applicant: Applied Materials, Inc., Santa Clara, CA (US)

(72) Inventors: Jiajie Cen, San Jose, CA (US); Zhiyuan Wu, San Jose, CA (US); Kevin Kashefi, San Ramon, CA (US); Yong Jin Kim, Albany, CA (US); Yang Zhou, Milpitas, CA (US); Zheng Ju, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 374 days.

(21) Appl. No.: 18/209,035

(22) Filed: Jun. 13, 2023

(65) Prior Publication Data

US 2024/0420996 A1      Dec. 19, 2024

(51) Int. Cl.
    *H10W 20/00*      (2026.01)
    *H01J 37/32*      (2006.01)
        (Continued)

(52) U.S. Cl.
    CPC ..... *H10W 20/034* (2026.01); *H01J 37/32357* (2013.01); *H01J 37/32816* (2013.01);
        (Continued)

(58) Field of Classification Search
    CPC ......... H01L 21/76844; H01L 21/31138; H01L 21/76846; H01L 21/76882;
        (Continued)

(56) References Cited

U.S. PATENT DOCUMENTS

| | | |
|---|---|---|
| 5,278,100 A | 1/1994 | Doan |
| 6,785,159 B2 | 8/2004 | Tuttle |

(Continued)

FOREIGN PATENT DOCUMENTS

| | | | |
|---|---|---|---|
| EP | 1120474 A1 | 8/2001 | |
| JP | 2013507009 A | * 2/2013 | ............. H10D 48/30 |

(Continued)

OTHER PUBLICATIONS

Pena, Luis Fabian, et al., "Vapor-Phase Cleaning and Corrosion Inhibition of Copper Films by Ethanol and Heterocyclic Amines", American Chemical Society: Applied Materials & Interfaces 2018, 10, Oct. 18, 2018, 38610-38620.

(Continued)

*Primary Examiner* — Dale E Page
*Assistant Examiner* — Quovaunda Jefferson
(74) *Attorney, Agent, or Firm* — SERVILLA WHITNEY LLC

(57) ABSTRACT

Methods of forming microelectronic devices comprise forming a dielectric layer on a substrate, the dielectric layer comprising at least one feature defining a gap including sidewalls and a bottom. The methods include forming a hardmask on the dielectric layer; selectively depositing a self-assembled monolayer (SAM) on the bottom of the gap and on the hardmask; treating the microelectronic device with a plasma to remove the self-assembled monolayer (SAM) from the hardmask; forming a barrier layer on the dielectric layer and on the hardmask; selectively depositing a metal liner on the barrier layer on the sidewall; and performing a gap fill process on the metal liner.

19 Claims, 5 Drawing Sheets

(51) Int. Cl.
   *H10P 50/28*        (2026.01)
   *H10W 20/41*        (2026.01)
   *H10W 20/44*        (2026.01)

(52) U.S. Cl.
   CPC ......... *H10P 50/287* (2026.01); *H10W 20/035*
   (2026.01); *H01J 2237/335* (2013.01); *H01J*
   *2237/336* (2013.01); *H10W 20/059* (2026.01);
   *H10W 20/425* (2026.01); *H10W 20/4403*
   (2026.01)

(58) Field of Classification Search
   CPC ......... H01L 21/76826; H01L 21/76849; H01L
   23/53209; H01L 23/53238; H01J
   37/32357; H01J 37/32816; H01J
   2237/335; H01J 2237/336; H10W 20/034;
   H10W 20/035; H10W 20/059; H10W
   20/425; H10W 20/4403; H10P 50/287
   See application file for complete search history.

(56) References Cited

U.S. PATENT DOCUMENTS

| | | | |
|---|---|---|---|
| 6,900,539 | B2 | 5/2005 | Motoyama |
| 8,232,148 | B2 | 7/2012 | Li et al. |
| 8,357,609 | B2 | 1/2013 | Ryan |
| 9,299,704 | B2 | 3/2016 | Ji et al. |
| 9,362,385 | B2 | 6/2016 | Cheng et al. |
| 10,643,895 | B2 | 5/2020 | Mebarki et al. |
| 2003/0017268 | A1 | 1/2003 | Hu et al. |
| 2003/0072884 | A1 | 4/2003 | Zhang et al. |
| 2004/0013803 | A1 | 1/2004 | Chung et al. |
| 2004/0224321 | A1* | 11/2004 | Nicolau ............... B01J 19/0046 |
| | | | 435/6.19 |
| 2007/0238279 | A1 | 10/2007 | Cerio |
| 2009/0032766 | A1 | 2/2009 | Rajaratnam et al. |
| 2009/0074983 | A1 | 3/2009 | Heys et al. |
| 2009/0215269 | A1 | 8/2009 | Boggs et al. |
| 2013/0313648 | A1 | 11/2013 | Chiang et al. |
| 2013/0337659 | A1 | 12/2013 | Ahn et al. |
| 2015/0167160 | A1* | 6/2015 | Chen ................. H01J 37/32422 |
| | | | 118/722 |
| 2018/0158686 | A1 | 6/2018 | Gelatos et al. |
| 2019/0109009 | A1 | 4/2019 | Longrie et al. |
| 2020/0035546 | A1 | 1/2020 | Kuo et al. |
| 2020/0105515 | A1 | 4/2020 | Maes et al. |
| 2020/0105592 | A1 | 4/2020 | Kuo et al. |
| 2020/0350204 | A1 | 11/2020 | Yu et al. |
| 2022/0037202 | A1 | 2/2022 | Lin et al. |
| 2022/0068826 | A1 | 3/2022 | Kuo et al. |
| 2023/0072614 | A1 | 3/2023 | Qu et al. |
| 2023/0154792 | A1* | 5/2023 | Chin ................. H01L 21/76849 |
| | | | 257/751 |

FOREIGN PATENT DOCUMENTS

| | | | |
|---|---|---|---|
| KR | 100936490 B1 | 1/2010 | |
| KR | 20220058852 A | 5/2022 | |
| KR | 20230074418 A | 5/2023 | |
| WO | 2016073707 A1 | 5/2016 | |
| WO | 2019060413 A1 | 3/2019 | |
| WO | WO-2020189509 A1 * | 9/2020 | ............ C23C 16/04 |
| WO | 2023076115 A1 | 5/2023 | |

OTHER PUBLICATIONS

PCT International Search Report and Written Opinion in PCT/US2024/033195 dated Sep. 10, 2024, 9 pages.

* cited by examiner

100

100

100

100

SELECTIVE SELF-ASSEMBLED MONOLAYER (SAM) REMOVAL

TECHNICAL FIELD

Embodiments of the disclosure generally relate to methods of forming a metal liner for interconnect structures. More particularly, embodiments of the disclosure are directed to methods of selectively removing a self-assembled monolayer (SAM) for controlling barrier and liner deposition.

BACKGROUND

Multiple challenges impede power and performance improvements when scaling transistors and interconnects to the 3 nm node, 2 nm node, 1.4 nm node, and beyond. Interconnects include metal lines that transfer current within the same device layer and metal vias that transfer current between layers. Pitch reduction narrows the width of both and increases resistance, and also increases the voltage drop across a circuit, throttling circuit speed and increasing power dissipation.

While transistor performance improves with scaling, the same cannot be said for interconnect metals. As dimensions shrink, interconnect via resistance can increase by a factor of 10. An increase in interconnect via resistance may result in resistive-capacitive (RC) delays that reduce performance and increases power consumption. A conventional copper interconnect structure includes a barrier layer and/or a metal liner deposited on the sidewalls of gap that provide a via the sidewalls made of a dielectric material, providing good adhesion, and preventing the copper from diffusing into the dielectric layer. Barrier layers can typically be the largest contributor to via resistance due to high resistivity. Past approaches have focused on reducing the thickness of barrier layers or finding barrier layers with lower resistivity to decrease via resistance. Increased via resistance remains an issue, especially in smaller features when barrier layers on sidewalls form an increasing percentage of the via volume.

The use of selective liners and 1-layer barrier-liners provides great potential for barrier/liner thinning down and Rc improvement. Copper (Cu) gap-fill has been facing challenges over narrower and narrower structures with high aspect ratios as the Cu interconnect nodes advances towards 2 nm, 1.4 nm, and beyond. Tungsten carbide (WC) hard masks prevent proper barrier and liner deposition and impact Cu reflow. Accordingly, there is a need for methods for depositing material layers that improve performance of interconnects, for example, reducing via resistance and improving deposition selectivity.

SUMMARY

Embodiments of the disclosure are directed to methods of forming a microelectronic device. In one or more embodiments, the method comprises: forming a dielectric layer on a substrate, the dielectric layer comprising at least one feature defining a gap including sidewalls and a bottom; forming a hardmask on the dielectric layer; selectively depositing a self-assembled monolayer (SAM) on the bottom of the gap and on the hardmask; treating the microelectronic device with a plasma to remove the self-assembled monolayer (SAM) from the hardmask; forming a barrier layer on the dielectric layer and on the hardmask; selectively depositing a metal liner on the barrier layer on the sidewall; and performing a gap fill process on the metal liner.

Further embodiments of the disclosure are directed to methods of forming a microelectronic device. In one or more embodiments, the method comprises: forming a dielectric layer on a substrate, the dielectric layer comprising at least one feature defining a gap including sidewalls and a bottom; forming a hardmask on the dielectric layer; selectively depositing a self-assembled monolayer (SAM) on the bottom of the gap and on the hardmask; treating the microelectronic device with a hydrogen ($H_2$) plasma in depletion mode to remove the self-assembled monolayer (SAM) from the hardmask; forming a barrier layer on the dielectric layer and on the hardmask; removing the SAM from the bottom of the gap; selectively depositing a metal liner on the barrier layer on the sidewall; and performing a gap fill process on the metal liner.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
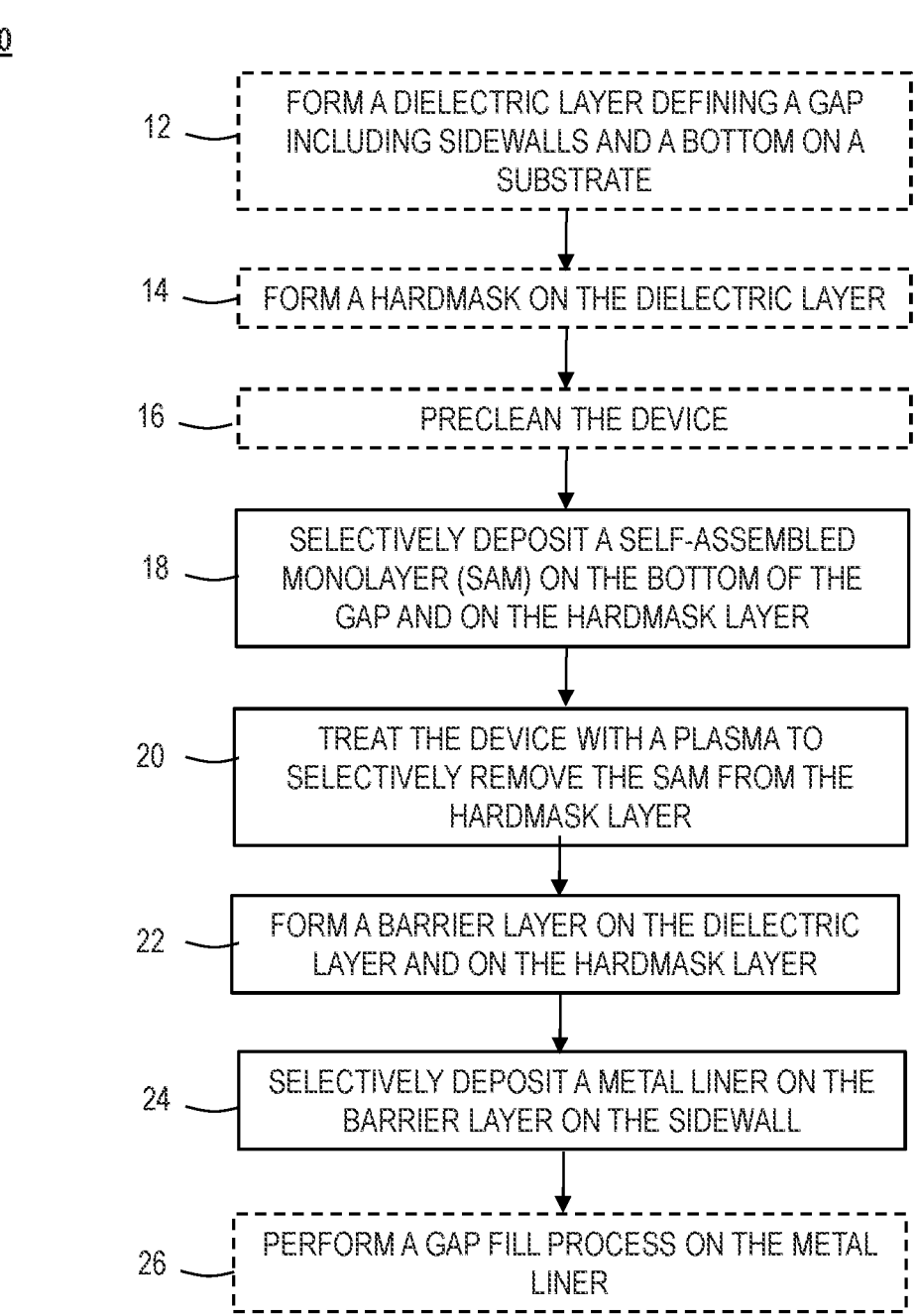
FIG. 1 illustrates a process flow diagram of a method of manufacturing a microelectronic device in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

Some embodiments of the disclosure provide methods for improving performance of interconnects. Interconnects comprise metal lines that transfer current within the same device layer, and metal vias that transfer current between layers. These lines and vias are formed with conductive metal such as copper or cobalt in gaps formed within the device. In one or more embodiments, a dielectric layer comprises at least one feature defining a gap including sidewalls and a bottom. In one or more embodiments, the gap comprises the metal lines and the metal vias. In one or more embodiments, the metal lines have a sidewall and a bottom. In one or more embodiments, the metal vias have a sidewall and a bottom. As used in this specification and the appended claims, unless specified otherwise, reference to the "bottom of the gap" is intended to mean the bottom of the metal via, which is nearest the substrate.

Embodiments of the disclosure provide methods of forming interconnect structures in the manufacture of microelectronic devices. In one or more embodiments, microelectronic devices described herein comprise at least one top interconnect structure that is interconnected to at least one bottom interconnect structure. Embodiments of the disclosure provide microelectronic devices and methods of manufacturing microelectronic devices that improve performance of interconnects, for example, reducing via resistance. In one or more embodiments, the method advantageously includes selectively removing a self-assembled monolayer (SAM) from the top surface of a hardmask layer and not from the bottom of the gap/feature. Because of the selective removal of the SAM, a barrier layer/liner can be formed on the microelectronic device advantageously without degradation in the barrier layer liner thickness, and thus maintaining reflow capability to fill the gap/feature. In embodiments where selective removal of the SAM is not performed, a thin liner forms on the hardmask and reflow is challenging.

FIG. 1 is a process flow diagram of an exemplary method of manufacturing a microelectronic device. Methods of forming microelectronic devices are described herein with reference to FIG. 1 and FIGS. 2A-2D. In FIGS. 2A-2D, a portion of a microelectronic device 100 is shown during stages of manufacture.

FIG. 1 illustrates a process flow diagram of a method 10 for forming a microelectronic device. FIG. 1 illustrates a method of forming any of the microelectronic devices of one or more embodiments shown in FIGS. 2A-2F. Referring to FIG. 1, the method 10 comprises, at operation 12, optionally forming a dielectric layer on a substrate. The dielectric layer comprises at least one feature defining a gap including sidewalls and a bottom. At operation 14, the method 10 optionally includes forming a hardmask on the dielectric layer. At operation 16, the method 10 optionally includes precleaning the microelectronic device. At operation 18, the method 10 comprises selectively depositing a self-assembled monolayer (SAM) on the bottom of the gap and on the hardmask. At operation 20, the method 10 comprises treating the device with a plasma to selectively remove the SAM from the hardmask. At operation 22, the method includes forming a barrier layer on the dielectric layer and on hardmask. At operation 24, the method 10 comprises selectively depositing a metal liner on the barrier layer on the sidewall. At operation 26, the method 10 optionally includes performing a gap fill process on the metal liner. The gap fill process can include forming one or more of a via and a line to form an interconnect in the microelectronic device.

Figure 2A:
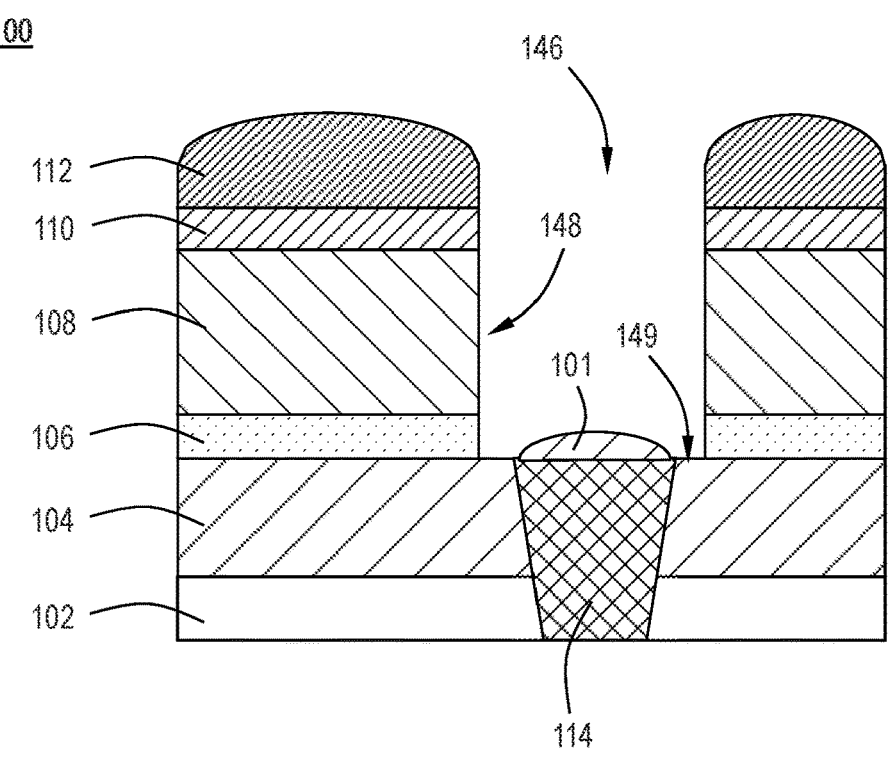
FIG. 2A illustrates a cross-sectional view of portion of a microelectronic device during a stage of manufacture in accordance with one or more embodiments of the disclosure.

In FIG. 2A, the microelectronic device 100 comprises a substrate 102, a metal layer 104 on the substrate, a conductive filled gap 114, an etch stop layer 106, and a dielectric layer 108 on the etch stop layer 106. The dielectric layer 108 comprises at least one feature defining a gap 146 including sidewalls 148 and a bottom 149. In some embodiments, the microelectronic device 100 comprises a metal layer 101 on the bottom 149 of the gap 146. In some embodiments, the metal layer 101 comprises metal contaminants from the provided substrate 102. In some embodiments, the metal layer 101 comprises one or more of a metal oxide or a metal nitride. Stated differently, in embodiments where the metal layer 101 comprises one or more of a metal oxide or a metal nitride, the metal layer 101 comprises metal oxide and/or metal nitride contaminants. In some embodiments, the metal layer 101 and the metal layer 104 form a metal interface.

In one or more embodiments, the substrate 102 is a wafer, for example a semiconductor substrate. In one or more embodiments, the substrate 102 is an etch stop layer on a wafer. In one or more embodiments, the substrate 102 is an aluminum oxide etch stop layer on a wafer.

In one or more embodiments, the metal layer 104 comprises one or more of ruthenium (Ru), cobalt (cobalt), molybdenum (Mo), or tantalum (Ta). In one or more embodiments, the metal layer 104 comprises one or more of a single layer of ruthenium (Ru) or a single layer of cobalt (Co). In one or more embodiments, a portion of the metal layer 104 is etched.

In one or more embodiments, a silicon oxide layer 110 is formed on the dielectric layer. In one or more embodiments, a hardmask layer 112 is formed on the dielectric layer 108. The hardmask layer 112 may comprise any suitable material known to the skilled artisan. In one or more embodiments, the hardmask layer 112 comprises one or more of titanium nitride (TiN), oxides, nitrides, tungsten carbide (WC) and the like.

In one or more embodiments, the conductive filled gap 114 comprises one or more of molybdenum (Mo), tungsten (W), copper (Cu), or cobalt (Co). It will be appreciated that in one or more embodiments, the conductive filled gap 114 forms a metal line that transfers current within the same device layer. In one or more embodiments, the etch stop layer 106 comprises one or more of aluminum oxide, silicon nitride, and aluminum nitride.

In one or more embodiments, the dielectric layer 108 is a low-k dielectric layer. In certain embodiments, the dielectric layer 108 comprises silicon oxide ($SiO_x$). In one or more embodiments, the dielectric layer 108 comprises $SiO_xH_y$ ($CH_z$). Further embodiments provide that the dielectric layer 108 comprises porous or carbon-doped $SiO_x$. In some embodiments, the dielectric layer 108 is a porous or carbon-doped $SiO_x$ layer with a k value less than about 5. In other embodiments, the dielectric layer 108 is a multilayer structure. For example, in one or more embodiments, the dielectric layer 108 comprises a multilayer structure having one or more of a dielectric layer, an etch stop layer, and a hard mask layer.

In one or more embodiments, the dielectric layer 108 comprises at least one feature defining a gap 146 including sidewalls 148 and a bottom 149. The Figures show substrates having a single feature for illustrative purposes; however, those skilled in the art will understand that there can be more than one feature. The shape of the feature can be any suitable shape including, but not limited to, trenches, cylindrical vias that, when filled with metal, transfer current between layers, and lines that transfer current within the same device layer. In some embodiments, the feature defines a gap 146 in the dielectric layer 108. As used herein, the term "feature" means any intentional surface irregularity. Suitable examples of features include but are not limited to trenches which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

Figure 2B:
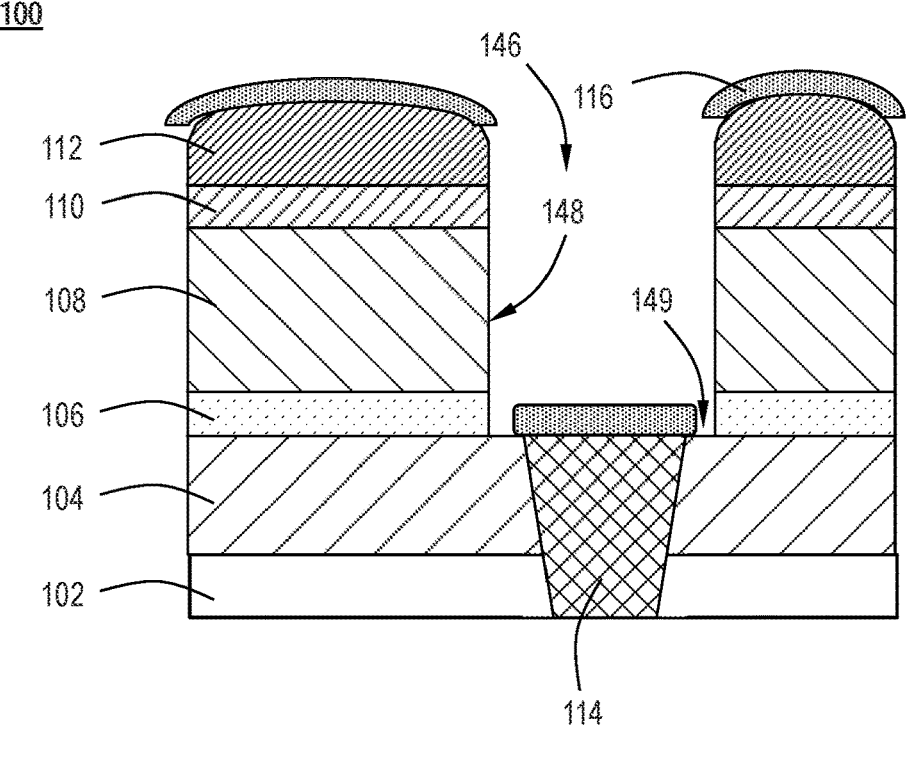
FIG. 2B illustrates a cross-sectional view of portion of a microelectronic device during a stage of manufacture in accordance with one or more embodiments of the disclosure.

FIG. 2B illustrates removal of the metal layer 101 formed in FIG. 2A. In some embodiments, the metal contaminants of the metal layer 101 are removed from the metal interface. In some embodiments, the metal oxide and/or metal nitride contaminants of the metal layer 101 are removed from the metal interface. The metal layer 101 may be removed by any suitable process known to the skilled artisan. In some embodiments, the metal layer 101 is removed by a pre-clean process. As used herein, the terms "preclean" and "pre-clean" may be used interchangeably. The pre-clean process may include any suitable pre-clean process known to the skilled artisan. In some embodiments, the pre-clean process comprises degassing the substrate 101 with or without hydrogen, an argon sputter with or without hydrogen, water vapor cleaning, or vapor phase cleaning such as automated process control (APC) cleans, e-APC cleans, and the like.

In some embodiments, the pre-clean process includes etching the metal layer 101 with dilute hydrofluoric acid (dilute HF), including greater than 100:1, such as 130:1 dilute HF, to remove the metal layer 101. In some embodiments, the pre-clean process may include a conventional plasma etch, or a remote plasma-assisted dry etch process, such as a SiCoNi™ etch process, commercially available from Applied Materials, Inc., located in Santa Clara, California. In a SiCoNi™ etch process, the device is exposed to $H_2$, $NF_3$, and/or $NH_3$ plasma species, e.g., plasma-excited hydrogen and fluorine species. For example, in some embodiments, the device may undergo simultaneous exposure to $H_2$, $NF_3$, and $NH_3$ plasma. The SiCoNi™ etch process may be performed in a SiCoNi™ Preclean chamber, which may be integrated into one of a variety of multi-processing platforms, include, for example, the Centura®, Dual ACP, Producer® GT, and Endura® platform, commercially available from Applied Materials®.

The wet etch process may include a hydrofluoric (HF) acid last process, i.e., the so-called "HF last" process, in which HF etching of surface is performed that leaves surface hydrogen-terminated. Alternatively, any other liquid-based pre-epitaxial pre-clean process may be employed. The etch process can be plasma or thermally based. The plasma processes can be any suitable plasma (e.g., conductively coupled plasma, inductively coupled plasma, microwave plasma). In some embodiments, removal of the metal layer 101 results in exposure of a top surface of the metal layer 104.

FIG. 2B illustrates a self-assembled monolayer (SAM) 116 selectively deposited on the bottom 149 of the gap and on the top surface of the hardmask layer 112. In one or more embodiments, the SAM 116 is formed on the metal layer 104. In one or more embodiments, the SAM 116 is deposited by exposing the bottom 149 of the gap and the top of the hardmask layer 112 to a hydrocarbon carried in argon (Ar) gas. In one or more embodiments, the SAM 116 comprises an unsaturated hydrocarbon.

In one or more embodiments, the use of an unsaturated hydrocarbon SAM 116 improved interconnect via resistance by minimizing via bottom metal liner growth with selective deposition of a metal liner on via sidewall rather than via bottom. Embodiments of the disclosure provide methods to selectively grow a metal liner, such as a Ru liner, on via sidewall versus the via bottom with high selectivity (e.g., the ratio of the sidewall liner thickness to bottom liner thickness is greater than 3, greater than 4, greater than 5, greater than 6, greater than 7, greater than 8, greater than 9 or greater than 10). Selection of SAM chemistry and a process enables metal (e.g., Ru) nucleation and growth only at via sidewall, not on the via bottom. Thinner or no metal (e.g., Ru) growth on via bottom reduces via resistance and Cu corrosion. Other liner materials include cobalt (Co), molybdenum (Mo), and tantalum (Ta). In specific embodiments, a SAM chemistry/process which can suppress metal liner growth at the via bottom (for example, less than 10 Angstroms, less than 5 Angstroms, less than 4 Angstroms, less than 3 Angstroms, less than 2 Angstroms or less than 1 Angstrom) and maintain metal liner growth at via sidewall (for example, 5 Angstroms or greater or 10 Angstroms or greater). The SAM chemistry facilitates achievement of selectivity on via bottom (e.g., Cu, Co, W) versus the via sidewall (e.g., TaN).

In some embodiments, the pressure of the processing chamber is controlled. The pressure of the processing chamber may be any suitable pressure for forming the SAM 116. In some embodiments, the pressure of the processing chamber is maintained at less than or equal to about 80 Torr, less than or equal to about 70 Torr, less than or equal to about 60 Torr, less than or equal to about 50 Torr, less than or equal to about 40 Torr, less than or equal to about 30 Torr, less than or equal to about 20 Torr, less than or equal to about 15 Torr, less than or equal to about 10 Torr, or less than or equal to about 5 Torr. In some embodiments, the pressure of the processing chamber is maintained at about 10 Torr, about 20 Torr, about 30 Torr, about 40 Torr, or about 50 Torr.

In one or more embodiments, a flow of argon (Ar) gas is configured to carry the unsaturated hydrocarbon from a container to the processing chamber. In some embodiments, the flow rate of the argon (Ar) gas that is configured to carry the unsaturated hydrocarbon into the processing chamber is controlled. The flow rate of the argon (Ar) gas may be any suitable flow rate for forming the passivation layer. In some embodiments, the flow rate of the argon (Ar) gas is in a range of about 50 sccm to about 100 sccm, or in a range of about 75 sccm to about 100 sccm. In one or more embodiments, the flow rate of the argon (Ar) gas is about 600 sccm. In some embodiments, the flow rate of the argon (Ar) gas is less than or equal to about 600 sccm, less than or equal to about 500 sccm, less than or equal to about 400 sccm, less than or equal to about 300 sccm, less than or equal to about 250 sccm, less than or equal to about 200 sccm, less than or equal to about 150 sccm, less than or equal to about 100 sccm, less than or equal to about 75 sccm, or less than or equal to about 50 sccm.

In some embodiments, the soak period, during which the unsaturated hydrocarbon is exposed to the substrate, is controlled. The soak period may be any suitable period for forming the SAM 116. In some embodiments, the soak period is from 1 to 200 s, for example from 1 to 10 s, greater than or equal to about 10 s, greater than or equal to about 20 s, greater than or equal to about 30 s, greater than or equal to about 45 s, greater than or equal to about 60 s, greater than or equal to about 80 s, greater than or equal to about 120 s, greater than or equal to about 150 s, or greater than or equal to about 200 s. In some embodiments, the soak period is about 60 s. In some embodiments, the soak period is about 200 s.

In one or more embodiments, the unsaturated hydrocarbon is in a liquid phase when the unsaturated hydrocarbon is in a container, such as an ampoule or a cylinder, from which the unsaturated hydrocarbon is delivered to the chamber in a carrier gas. In some embodiments, the unsaturated hydrocarbon is in a saturated vapor phase in the container when the container has a pressure of about 0.1 torr. In one or more embodiments, a temperature of the container is lower than the temperature in the processing chamber. In one or more embodiments, a carrier gas such as argon (Ar) gas carries the saturated vapor phase unsaturated hydrocarbon from the container to the processing chamber. In some embodiments, a temperature of the processing chamber is controlled during exposure to the unsaturated hydrocarbon. The temperature of the processing chamber may also be referred to as the operating temperature. In some embodiments, the temperature of the processing chamber is in a range of about 150° C. to about 400° C., for example, 200° C. to about 300° C. In some embodiments, the temperature of the processing chamber is less than or equal to about 300° C., less than or equal to about 275° C., less than or equal to about 250° C., less than or equal to about 225° C., or less than or equal to about 200° C.

Figure 2C:
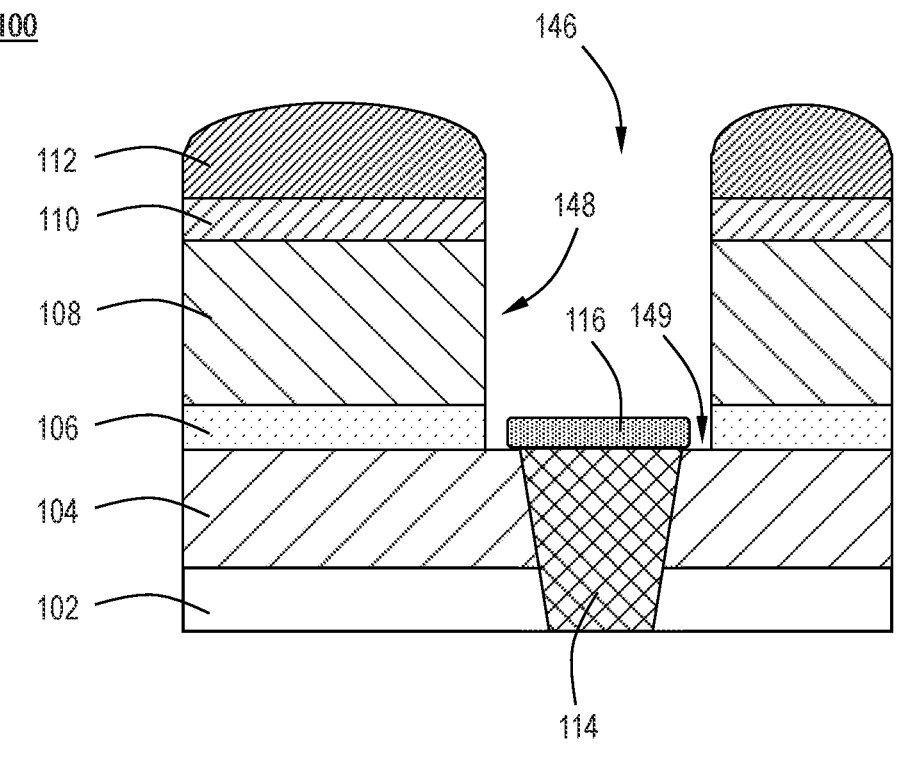
FIG. 2C illustrates a cross-sectional view of portion of a microelectronic device during a stage of manufacture in accordance with one or more embodiments of the disclosure.

With reference to FIG. 2C, the SAM 116 is selectively removed from the top surface of the hardmask layer 112 but remains on the bottom of the gap 149 on the conductive material 114. In some embodiments, the plasma treatment process comprises treating the microelectronic device 100 with a plasma in depletion mode. In some embodiments, the plasma comprises hydrogen (H$_2$). In some embodiments, the plasma is a remote plasma. In some embodiments, the plasma is a capacitively coupled plasma with a pulsed hydrogen (H$_2$) supply. In some embodiments, the depletion mode comprises a low pressure and a short time treatment.

The plasma source can be an inductively coupled plasma (ICP) with gases hydrogen (H$_2$), helium (He) and/or argon (Ar). The plasma can be remote or direct plasma to the semiconductor substrate 102. The wafer processing conditions may be any suitable processing condition known to the skilled artisan. The wafer temperature may be in a range of from room temperature to 350° C. In some embodiments, the pressure is in a range of from 0.2 mTorr to 100 mTorr. In some embodiments, the process time is in a range of from 5 seconds to 60 seconds. Typically, one process condition, for example, can be ICP remote plasma by H$_2$ and Ar under 50 mTorr for 30 seconds.

The plasma source can be a capacitively coupled plasma (CCP) with gases hydrogen (H$_2$), helium (He) and/or argon (Ar). The plasma can be remote or direct plasma to the semiconductor substrate 102. The wafer temperature may be in a range of from room temperature to 350° C. In some embodiments, the pressure is in a range of from 100 mTorr to 20,000 mTorr. In some embodiments, the process time is in a range of from 5 seconds to 60 seconds. In some embodiments, for example, the process may include gas injection or gas pulsing process for depletion mode applications. Typically, one process condition can be CCP direct plasma by H$_2$ and Ar under 1000 mTorr for 30 s with H$_2$ gas pulsing injection (e.g., 1 second per cycle).

The plasma source can be a remote plasma source (RPS) unit with gases hydrogen (H$_2$), helium (He) and/or argon (Ar). The wafer temperature may be in a range of from room temperature to 350° C. In some embodiments, the pressure is in a range of from 0.2 mTorr to 2,000 mTorr. In some embodiments, the process time is in a range of from 5 seconds to 60 seconds. Typically, one process condition can be RPS remote plasma by H$_2$ and He under 300 mTorr for 30 seconds.

Figure 2D:
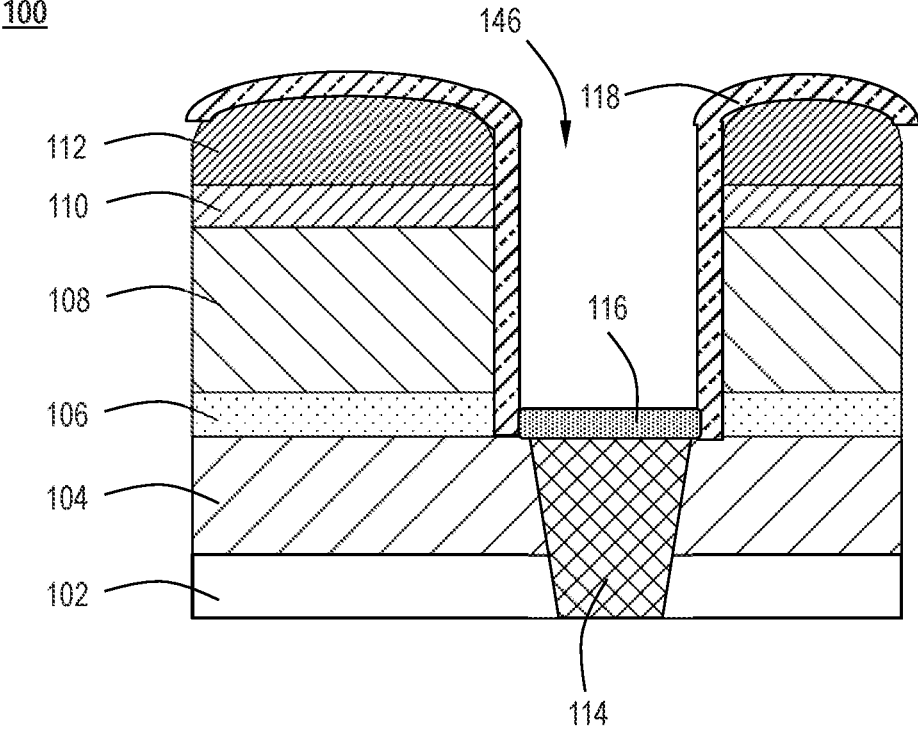
FIG. 2D illustrates a cross-sectional view of portion of a microelectronic device during a stage of manufacture in accordance with one or more embodiments of the disclosure.

Referring to FIG. 2D, a barrier layer 118 is shown deposited over the sidewalls 148 and not on the SAM 116. In one or more embodiments, the barrier layer 118 does not form on the bottom 149 of the gap 146. In one or more unillustrated embodiments, when the SAM 116 is not present, the deposition of the barrier layer 118 is substantially conformal. In one or more unillustrated embodiments where the SAM 116 is not present, the barrier layer 118 forms on the sidewalls 148, and the bottom 149 of the gap 146. As used herein, a layer which is "substantially conformal" refers to a layer where the thickness is about the same throughout (e.g., on the top, middle and bottom of sidewalls 148 and on the bottom 149 of the gap 146). A layer which is substantially conformal varies in thickness by less than or equal to about 5%, 2%, 1% or 0.5%. In one or more embodiments, the barrier layer 118 is selectively deposited on at least a portion of the sidewalls 148. In one or more unillustrated embodiments, the barrier layer 118 is selectively deposited on at least a portion of the bottom 149. In one or more embodiments, the barrier layer 118 may cover the entirety of the sidewalls 148.

In one or more embodiments, the barrier layer 118 is selectively deposited by atomic layer deposition (ALD), and has a thickness in a range of from about 2 Å to about 10 Å. In some embodiments, the barrier layer 118 is deposited in a single ALD cycle. In other embodiments, the barrier layer 118 is deposited in from 1 to 20 ALD cycles. In one or more embodiments, each cycle of the 1 to 20 ALD cycles is configured to deposit a thickness of about 0.5 Å of the barrier layer 118.

In one or more embodiments, when the barrier layer 118 formed on the bottom 149 and the sidewalls 148, there is a ratio of the thickness of the barrier layer 118 thickness on the sidewalls 148 to the thickness of the barrier layer 118 thickness on the bottom 149, the ratio being greater than 6. In one or more, the ratio is greater than 5, greater than 4, greater than 3, greater than 2, or greater than 1. In one or more embodiments, when the SAM 116 is present, the barrier layer 118 has a thickness in a range of from 5 Angstroms to 20 Angstroms on the sidewalls 148. In one or more embodiments, the barrier layer 118 has a thickness of less than or equal to 5 Angstroms on the bottom 149. In one or more embodiments, the barrier layer 118 has a thickness of less than or equal to 4 Angstroms, less than or equal to 3 Angstroms, less than or equal to 2 Angstroms, or less than or equal to 1 Angstrom on the bottom 149. In one or more embodiments, the barrier layer 118 does not form on the bottom 149.

Figure 2E:
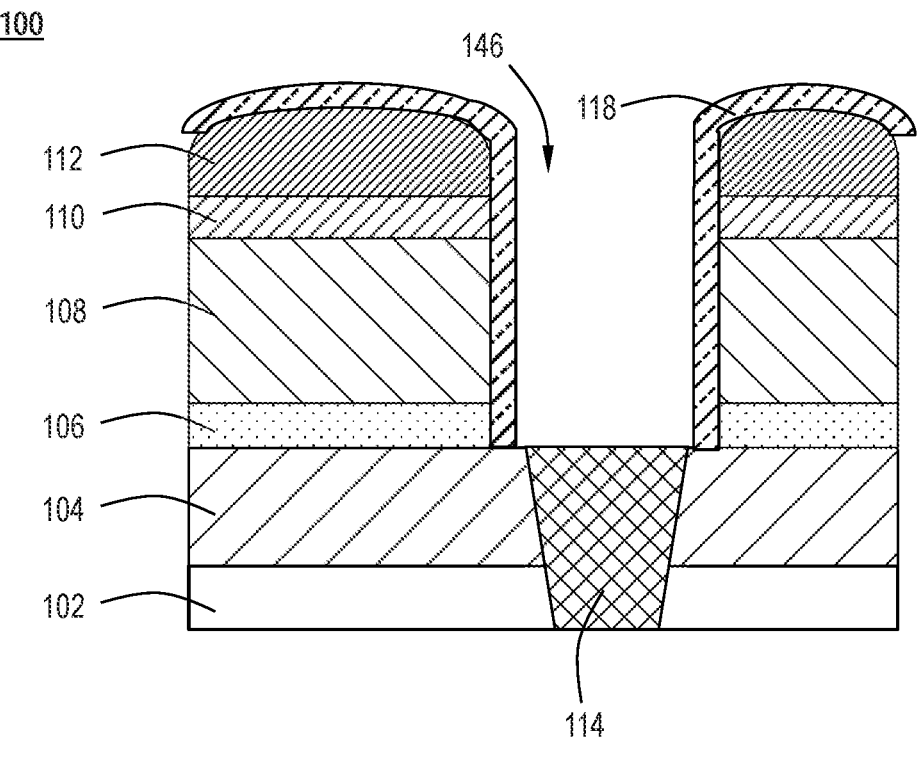
FIG. 2E illustrates a cross-sectional view of portion of a microelectronic device during a stage of manufacture in accordance with one or more embodiments of the disclosure.

FIG. 2E illustrates removal of the SAM 116. In one or more embodiments, removing the SAM 116 comprises a plasma treatment process comprising flowing one or more of hydrogen ($H_2$) or argon (Ar). In one or more embodiments, the plasma treatment process comprises increasing a density of the barrier layer 118. In some embodiments, the plasma treatment process comprises treating the microelectronic device 100 with a plasma in depletion mode. In some embodiments, the plasma comprises hydrogen ($H_2$). In some embodiments, the plasma is a remote plasma. In some embodiments, the plasma is a capacitively coupled plasma with a pulsed hydrogen ($H_2$) supply. In some embodiments, the depletion mode comprises a low pressure and a short time treatment.

The plasma source can be an inductively coupled plasma (ICP) with gases hydrogen ($H_2$), helium (He) and/or argon (Ar). The plasma can be remote or direct plasma to the semiconductor substrate 102. The wafer processing conditions may be any suitable processing condition known to the skilled artisan. The wafer temperature may be in a range of from room temperature to 350° C. In some embodiments, the pressure is in a range of from 0.2 mTorr to 100 mTorr. In some embodiments, the process time is in a range of from 5 seconds to 60 seconds. Typically, one process condition, for example, can be ICP remote plasma by $H_2$ and Ar under 50 mTorr for 30 seconds.

The plasma source can be a capacitively coupled plasma (CCP) with gases hydrogen ($H_2$), helium (He) and/or argon (Ar). The plasma can be remote or direct plasma to the semiconductor substrate 102. The wafer temperature may be in a range of from room temperature to 350° C. In some embodiments, the pressure is in a range of from 100 mTorr to 20,000 mTorr. In some embodiments, the process time is in a range of from 5 seconds to 60 seconds. In some embodiments, for example, the process may include gas injection or gas pulsing process for depletion mode applications. Typically, one process condition can be CCP direct plasma by $H_2$ and Ar under 1000 mTorr for 30 s with $H_2$ gas pulsing injection (e.g., 1 second per cycle).

The plasma source can be a remote plasma source (RPS) unit with gases hydrogen ($H_2$), helium (He) and/or argon (Ar). The wafer temperature may be in a range of from room temperature to 350° C. In some embodiments, the pressure is in a range of from 0.2 mTorr to 2,000 mTorr. In some embodiments, the process time is in a range of from 5 seconds to 60 seconds. Typically, one process condition can be RPS remote plasma by $H_2$ and He under 300 mTorr for 30 seconds.

Figure 2F:
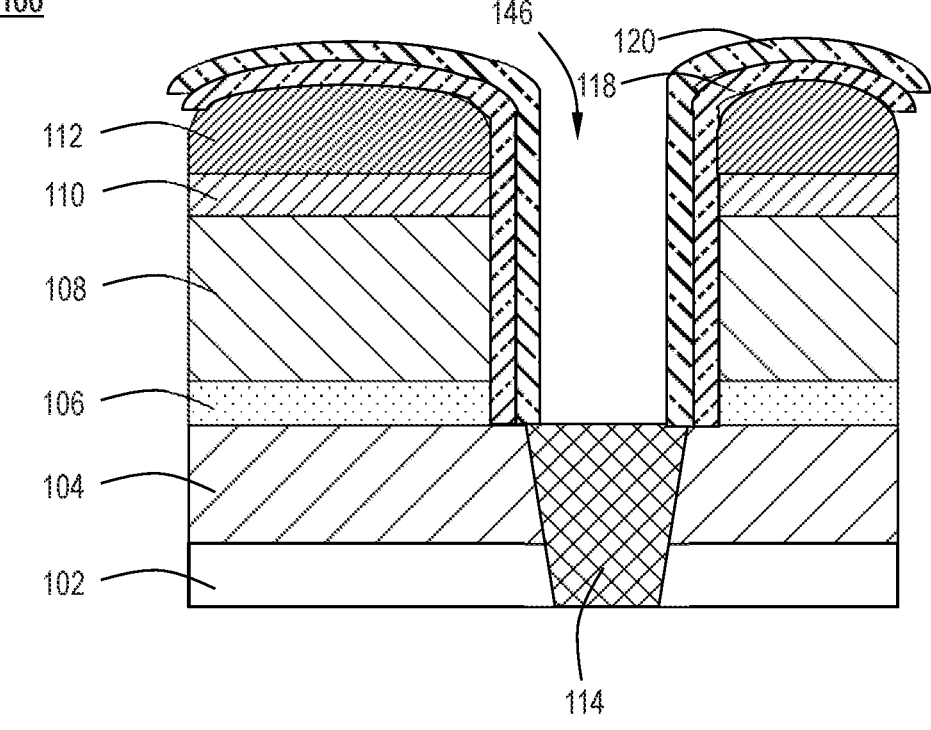
FIG. 2F illustrates a cross-sectional view of a portion of a microelectronic device during a stage of manufacture in accordance with one or more embodiments of the disclosure.

FIG. 2F illustrates a metal liner 120 selectively deposited on the barrier layer 118 on the sidewalls 148 of the dielectric layer 108 and on the hardmask 112. In some embodiments, the metal liner 120 is conformally deposited on the barrier layer 118. In some embodiments, the metal liner 120 is deposited at a thickness on the sidewalls 148 that is less than a thickness of the metal liner 120 deposited on the bottom 149. In some embodiments, the metal liner 120 is deposited at a thickness on the sidewalls 148 and is not deposited on the bottom 149.

The metal liner 120 comprises one or more of ruthenium (Ru), cobalt (cobalt), molybdenum (Mo), and tantalum (Ta). In some embodiments, the metal liner 120 comprises a single layer of ruthenium (Ru).

In one or more embodiments, selectively removing the self-assembled monolayer (SAM) 116 from the top surface of a hardmask layer 112 and not from the bottom of the gap/feature 149 advantageously forms a barrier layer 118/liner 120 on the microelectronic device without degradation in the barrier layer 118/liner 120 thickness. Thus, reflow capability is maintained to fill the gap/feature 146.

Embodiments of the disclosure advantageously provide methods of forming microelectronic devices having reduced via resistance and reduced Cu corrosion. Some of the disclosure advantageously provide methods of forming microelectronic devices having improved copper (Cu) reflow capabilities. Embodiments of the disclosure advantageously provide methods of forming microelectronic devices which reduce a resistance of a via by at least 20% as compared to a resistance of a via in a microelectronic device where a metal liner is not selectively deposited. In one or more embodiments, the resistance of the vias of microelectronic devices described herein is reduced by at least 15%, at least 10% or at least 5% as compared to a resistance of a via in a microelectronic device where a metal liner is not selectively deposited.

In one or more embodiments, the barrier layer 118 and/or metal liner 120 may be deposited via ALD. In a typical ALD process, alternating pulses or flows of "A" precursor and "B" precursor can be used to deposit a film. The alternating exposure of the surface to reactants "A" and "B" is continued until the desired thickness film is reached. However, instead of pulsing the reactants, the gases can flow simultaneously from one or more gas delivery head or nozzle and the substrate and/or gas delivery head can be moved such that the substrate is sequentially exposed to each of the reactive gases. Of course, the aforementioned ALD cycles are merely exemplary of a wide variety of ALD process cycles in which a deposited layer is formed by alternating layers of precursors and co-reactants.

In one or more embodiments, the co-reactants are in vapor or gas form. The reactants may be delivered with a carrier gas. A carrier gas, a purge gas, a deposition gas, or other process gas may contain nitrogen, hydrogen, argon, neon, helium, or combinations thereof. The various plasmas described herein, such as the nitrogen plasma or the inert gas plasma, may be ignited from and/or contain a plasma co-reactant gas.

In one or more embodiments, the various gases for the process may be pulsed into an inlet, through a gas channel, from various holes or outlets, and into a central channel. In one or more embodiments, the deposition gases may be sequentially pulsed to and through a showerhead. Alternatively, as described above, the gases can flow simultaneously through gas supply nozzle or head and the substrate and/or the gas supply head can be moved so that the substrate is sequentially exposed to the gases.

In one or more embodiments, the barrier layer 118 material and liner 120 film are deposited using a multi-chamber process with separation of the barrier layer 118 material (e.g., tantalum nitride (TaN)) and the metal liner 120 film. In other embodiments, a single chamber approach is used, with all processes occurring within one chamber and the different layers/films separated in processing by gas purges.

Some embodiments of the disclosure are directed to barrier applications, e.g., copper barrier applications. The barrier layer 118 formed by one or more embodiments may be used as a copper barrier. Suitable barrier layers for copper barrier applications include, but are not limited to, TaN and MnN. For copper barrier applications, suitable dopants include, but are not limited to, Ru, Cu, Co, Mn, Al, Ta, Mo, Nb, V, or combinations thereof. A plasma treatment can be used after doping to promote the intermetallic compound formation between the matrix and dopant, as well as removing film impurities and improving the density of the barrier layer. In other embodiments, post treatment can include, but is not limited to, physical vapor deposition (PVD) treatment, thermal anneal, chemical enhancement, or the like. In some copper barrier applications, a high frequency plasma (defined as greater than about 14 MHz or about 40 MHz or greater) can be used with any inert gas, including, but not limited to, one or more of neon (Ne), hydrogen ($H_2$), and argon (Ar) gas. In one or more embodiments, to prevent low-k damage, a higher plasma frequency can be used (higher than 13.56 MHz). In some embodiments, the barrier layer is a copper barrier and comprises TaN doped with Ru.

Suitable precursors for depositing a liner layer, such as metal liner 120, include metal-containing precursors such as carbonyl-containing and cyclopentadiene-containing precursors. In a non-limiting example, if the liner layer is RuCo, the Ru-containing precursor may be triruthenium dodecacarbonyl $Ru_3(CO)_{12}$ and the Co-containing precursor may be dicobalt hexacarbonyl tertbutylacetylene (CCTBA). If the liner layer is TaRu, the Ta-containing precursor may be pentakis (dimethlamino) tantalum (PDMAT). Other suitable precursors are known to those skilled in the art. Organic species in organic-containing precursors for liner layers may get partially incorporated into the underlying layer (such as a barrier or dielectric layer), which may increase the adhesion at the liner layer-underlying layer interface.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

The metal liner film can be formed by depositing alternating layer two metals or co-reacting two metal precursors by CVD, PVD or ALD. Depending on the liner metals used, a co-reactant or co-precursor may be used to deposit the liner 120 film. In one or more embodiments, ion implantation may be used for incorporating a second metal into a liner film comprised of a first metal. In other embodiments, physical vapor deposition (PVD) co-treatment may be used to add a second metal into the doped liner film formed over the barrier layer. In further embodiments, the liner film may be annealed inside an atmosphere comprising the second metal to thermally diffuse the second metal into the liner film of the first metal to form a liner film over the barrier layer.

In some embodiments, instead of or in addition to using a co-reactant, a post-plasma treatment step may be used after exposing the liner film comprising the first metal to the optional second metal precursor. According to one or more embodiments, the plasma comprises any suitable inert gas known to the skilled artisan. In one or more embodiments, the plasma comprises one or more of helium (He), argon (Ar), ammonia ($NH_3$), hydrogen ($H_2$), and nitrogen ($N_2$). In some embodiments, the plasma may comprise a mixture of Ar and $H_2$, such as a mixture having an Ar:$H_2$ molar ratio in the range from 1:1 to 1:15. The plasma power may be in the range from about 200 to about 1000 Watts. The plasma frequency may be in the range from 350 kHz to 40 MHz. The plasma treatment time may vary from 5 second to 60 seconds, such as in the range from 10 seconds to 30 seconds. In some embodiments, the pressure during plasma treatment may be in the range from 0.5 to 50 Torr, such as from 1 to 10 Torr. In some embodiments, the wafer spacing may be in the range from 100 mils to 600 mils.

In one or more embodiments, the liner 120 film comprising the first metal may be exposed to the second metal precursor during deposition, i.e., the second metal precursor may be used sequentially in an ALD cycle to provide a liner film comprised of two metals on the barrier layer. In various embodiments, the duration of the exposure to the second metal-containing precursor may range from 1 to 60 seconds, such as in the range from 3 to 30 seconds or from 5 to 10 seconds.

Figure 2G:
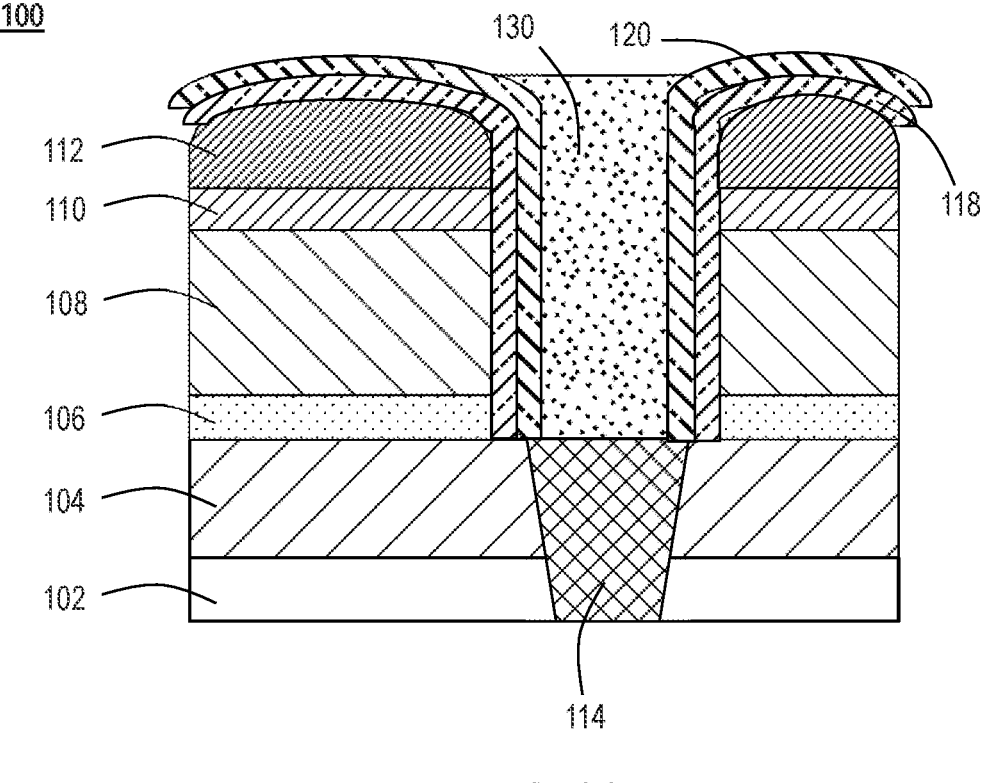
FIG. 2G illustrates a cross-sectional view of a portion of a microelectronic device during a stage of manufacture in accordance with one or more embodiments of the disclosure.

Referring to FIG. 2G, in one or more embodiments, a gap fill process comprises filling the gap 146 with a gap fill metal material 130. The gap fill metal material 130 may comprise any suitable material known to the skilled artisan. In one or more embodiments, the gap fill metal material 130 comprises one or more of copper (Cu) or cobalt (Co). In one or more embodiments, the gap 146 is filled by reflow.

In one or more embodiments, the methods described herein comprise an optional post-processing operation. The optional post-processing operation can be, for example, a process to modify film properties (e.g., annealing) or a further film deposition process (e.g., additional ALD or CVD processes) to grow additional films. In some embodiments, the optional post-processing operation can be a process that modifies a property of the deposited film. In some embodiments, the optional post-processing operation comprises annealing the as-deposited film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the metal liner layers.

In some embodiments, the substrate is moved from a first chamber to a separate, next chamber for further processing. The substrate can be moved directly from the first chamber to the separate processing chamber, or the substrate can be moved from the first chamber to one or more transfer chambers, and then moved to the separate processing chamber. In some embodiments, the deposition of the barrier layer and the dopant film can be done in a single chamber, and then the post-processing can be performed in a separate chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. However, the exact arrangement and combination of chambers may be altered for purposes of performing specific steps of a process as described herein. Other processing chambers which may be used include, but are not limited to, cyclic deposition including a deposition step, and an annealing or treatment step, atomic layer deposition (ALD), chemical vapor deposition (CVD), physical vapor deposition (PVD), etch, pre-clean, chemical clean, plasma nitridation, degas, orientation, hydroxylation, and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed, and unloaded before another substrate is processed. The substrate can also be processed in a continuous manner, similar to a conveyer system, in which multiple substrates are individually loaded into the first part of the chamber, move through the chamber, and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support, and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases.

Rotating the substrate during processing (either continuously or in steps) may help produce a more uniform deposition or etch by minimizing the effect of, for example, local variability in gas flow geometries.

Another aspect of the disclosure pertains to a non-transitory computer readable medium including instructions, that, when executed by a controller of a processing system, causes the processing system to perform operations of the methods described herein. In one embodiment, a non-transitory computer readable medium including instructions, that, when executed by a controller of a processing system, causes the processing system to perform operations of the methods described herein with respect to FIGS. 1 and 2A-2G.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a microelectronic device, the method comprising:
   forming a dielectric layer on a substrate, the dielectric layer comprising at least one feature defining a gap including sidewalls and a bottom;
   forming a hardmask on the dielectric layer;
   selectively depositing a self-assembled monolayer (SAM) on the bottom of the gap and on the hardmask;
   treating the microelectronic device with a plasma to remove the self-assembled monolayer (SAM) from the hardmask, the plasma comprising one or more of hydrogen ($H_2$) or Argon (Ar);
   forming a barrier layer on the dielectric layer and on the hardmask;
   selectively depositing a metal liner on the barrier layer on the sidewall; and
   performing a gap fill process on the metal liner,
   wherein treating the microelectronic device with the plasma comprises increasing a density of the barrier layer.

2. The method of claim 1, wherein the metal liner is deposited at a thickness on the sidewalls that is greater than a thickness of the metal liner deposited on the bottom.

3. The method of claim 1, wherein the metal liner is deposited on the sidewalls and not on the bottom.

4. The method of claim 1, wherein selectively depositing the SAM comprises exposing the bottom of the gap and the hardmask to a hydrocarbon carried in an argon (Ar) gas.

5. The method of claim 1, further comprising removing the SAM from the bottom of the gap after forming the barrier layer on the dielectric layer and the hardmask.

6. The method of claim 1, wherein the hardmask comprises one or more of tungsten carbide (WC), titanium nitride (TiN), oxides, and nitrides.

7. The method of claim 1, wherein the metal liner comprises one or more of ruthenium (Ru), cobalt (cobalt), molybdenum (Mo), and tantalum (Ta).

8. The method of claim 7, wherein the metal liner comprises a single layer of ruthenium (Ru).

9. The method of claim 7, wherein the selective ruthenium (Ru) deposition on the sidewall comprises a cyclic deposition process using a ruthenium (Ru) precursor carried by an argon (Ar) gas to form a deposited ruthenium layer.

10. The method of claim 9, wherein the cyclic deposition process further comprises annealing the deposited ruthenium layer while flowing hydrogen ($H_2$) and annealing the deposited ruthenium layer.

11. The method of claim 10, wherein the cyclic deposition process is performed in a substrate processing chamber at a first pressure to form the deposited ruthenium layer, and annealing the deposited ruthenium layer is performed while the substrate processing chamber is at a second pressure that is greater than the first pressure.

12. The method of claim 1, wherein the gap fill process comprises filling the gap with one or more of copper (Cu) or cobalt (Co).

13. The method of claim 1, wherein the plasma treatment comprises treating the microelectronic device with a plasma in a depletion mode.

14. The method of claim 13, herein the plasma comprises hydrogen ($H_2$).

15. The method of claim 13, wherein the plasma is a remote plasma.

16. The method of claim 13, wherein the plasma is a capacitively coupled plasma with a pulsed hydrogen ($H_2$) supply.

17. The method of claim 13, wherein the depletion mode comprises a low pressure and an abbreviated time treatment.

18. A method of forming a microelectronic device, the method comprising:

forming a dielectric layer on a substrate, the dielectric layer comprising at least one feature defining a gap including sidewalls and a bottom;

forming a hardmask on the dielectric layer;

selectively depositing a self-assembled monolayer (SAM) on the bottom of the gap and on the hardmask;

treating the microelectronic device with a hydrogen ($H_2$) plasma in a depletion mode to remove the self-assembled monolayer (SAM) from the hardmask;

forming a barrier layer on the dielectric layer and on the hardmask, wherein treating the microelectronic device with the hydrogen (Ha) plasma comprises increasing a density of the barrier layer;

removing the SAM from the bottom of the gap;

selectively depositing a metal liner on the barrier layer on the sidewall; and performing a gap fill process on the metal liner.

19. The method of claim 18, wherein the depletion mode comprises a low pressure and a short time treatment.

* * * * *